(12) United States Patent
Owada et al.

(10) Patent No.: US 8,778,814 B2
(45) Date of Patent: Jul. 15, 2014

(54) SILICON OXYCARBIDE, GROWTH METHOD OF SILICON OXYCARBIDE LAYER, SEMICONDUCTOR DEVICE AND MANUFACTURE METHOD FOR SEMICONDUCTOR DEVICE

(71) Applicant: Fujitsu Semiconductor Limited, Yokohama (JP)

(72) Inventors: Tamotsu Owada, Kawasaki (JP); Shun-ichi Furuyama, Kawasaki (JP); Hirofumi Watantani, Kawasaki (JP); Kengo Inoue, Kawasaki (JP); Atsuo Shimizu, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/966,326

(22) Filed: Aug. 14, 2013

(65) Prior Publication Data
US 2013/0330912 A1 Dec. 12, 2013

Related U.S. Application Data

(62) Division of application No. 13/493,244, filed on Jun. 11, 2012, now abandoned, which is a division of application No. 12/314,036, filed on Dec. 3, 2008, now Pat. No. 8,349,722, which is a division of application No. 11/206,955, filed on Aug. 19, 2005, now Pat. No. 7,485,570, which is a division of application No. 10/694,826, filed on Oct. 29, 2003, now Pat. No. 6,949,830.

(30) Foreign Application Priority Data

Oct. 30, 2002 (JP) .................................. 2002-315900

(51) Int. Cl.
*H01L 21/00* (2006.01)

(52) U.S. Cl.
USPC .......................... 438/780; 438/778; 438/769

(58) Field of Classification Search
USPC ......................................... 438/780, 778, 769
See application file for complete search history.

(56) References Cited

U.S. PATENT DOCUMENTS

| 4,717,585 A | 1/1988 | Ishihara et al. |
| 5,656,212 A | 8/1997 | Lee et al. |

(Continued)

FOREIGN PATENT DOCUMENTS

| JP | 02-219232 A | 8/1990 |
| JP | 2000-049157 A | 2/2000 |

(Continued)

OTHER PUBLICATIONS

Japanese Office Action dated Apr. 20, 2010, issued in corresponding Japanese Patent Application No. 2007-179347 (With Translation).

(Continued)

*Primary Examiner* — Laura Menz
(74) *Attorney, Agent, or Firm* — Westerman, Hattori, Daniels & Adrian, LLP

(57) ABSTRACT

A method of manufacturing a semiconductor device includes the steps of: preparing an underlying structure having a silicon carbide layer covering a copper wiring, and growing silicon oxycarbide on the underlying structure by vapor deposition using, as source gas, tetramethylcyclotetrasiloxane, carbon dioxide gas and oxygen gas, a flow rate of said oxygen gas being at most 3% of a flow rate of the carbon dioxide gas. The surface of the silicon carbide layer of the underlying structure may be treated with a plasma of weak oxidizing gas which contains oxygen and has a molecular weight larger than that of $O_2$ to bring the surface more hydrophilic. Film peel-off and cracks in the interlayer insulating layer decrease.

7 Claims, 13 Drawing Sheets

(56) References Cited

U.S. PATENT DOCUMENTS

| | | | |
|---|---|---|---|
| 6,312,793 B1 | 11/2001 | Grill et al. | |
| 6,437,443 B1 | 8/2002 | Grill et al. | |
| 6,441,491 B1 * | 8/2002 | Grill et al. | 257/759 |
| 6,479,110 B2 | 11/2002 | Grill et al. | |
| 6,506,692 B2 | 1/2003 | Andideh | |
| 6,541,398 B2 | 4/2003 | Grill et al. | |
| 6,583,048 B1 | 6/2003 | Vincent et al. | |
| 6,593,247 B1 | 7/2003 | Huang et al. | |
| 6,593,655 B1 | 7/2003 | Loboda et al. | |
| 6,596,627 B2 | 7/2003 | Mandal | |
| 6,596,655 B1 | 7/2003 | Cheung et al. | |
| 6,660,656 B2 | 12/2003 | Cheung et al. | |
| 6,664,641 B2 | 12/2003 | Ohsaki et al. | |
| 6,667,553 B2 | 12/2003 | Cerny et al. | |
| 6,693,046 B2 | 2/2004 | Takigawa et al. | |
| 6,737,746 B2 | 5/2004 | Matsuura | |
| 6,756,323 B2 * | 6/2004 | Grill et al. | 438/780 |
| 6,768,200 B2 | 7/2004 | Grill et al. | |
| 6,770,573 B2 | 8/2004 | Grill et al. | |
| 6,777,171 B2 | 8/2004 | Xu et al. | |
| 6,790,789 B2 | 9/2004 | Grill et al. | |
| 6,815,329 B2 | 11/2004 | Babich et al. | |
| 6,821,571 B2 | 11/2004 | Huang | |
| 6,838,393 B2 | 1/2005 | Yim et al. | |
| 6,852,651 B2 | 2/2005 | Shioya et al. | |
| 6,890,639 B2 | 5/2005 | Mandal | |
| 6,927,178 B2 | 8/2005 | Kim et al. | |
| 6,949,830 B2 | 9/2005 | Owada et al. | |
| 7,030,468 B2 | 4/2006 | Gates et al. | |
| 7,049,247 B2 | 5/2006 | Gates et al. | |
| 7,057,288 B2 | 6/2006 | Yuasa | |
| 7,088,003 B2 | 8/2006 | Gates et al. | |
| 7,098,476 B2 | 8/2006 | Babich et al. | |
| 7,112,617 B2 | 9/2006 | Kim et al. | |
| 7,157,384 B2 | 1/2007 | Yim et al. | |
| 7,205,224 B2 | 4/2007 | Mandal | |
| 7,205,249 B2 | 4/2007 | Cheung et al. | |
| 7,223,670 B2 | 5/2007 | Callegari et al. | |
| 7,282,241 B2 | 10/2007 | Kim et al. | |
| 7,465,659 B2 | 12/2008 | Yim et al. | |
| 7,485,570 B2 | 2/2009 | Owada et al. | |
| 7,718,269 B2 | 5/2010 | Takayasu et al. | |
| 7,740,933 B2 | 6/2010 | Kim et al. | |
| 7,745,328 B2 | 6/2010 | Yim et al. | |
| 8,349,722 B2 | 1/2013 | Owada et al. | |
| 2002/0098714 A1 | 7/2002 | Grill et al. | |
| 2002/0137359 A1 | 9/2002 | Grill et al. | |
| 2002/0180051 A1 | 12/2002 | Grill et al. | |
| 2003/0134505 A1 | 7/2003 | Dalton et al. | |
| 2003/0139062 A1 | 7/2003 | Grill et al. | |
| 2003/0234450 A1 | 12/2003 | Grill et al. | |
| 2004/0002208 A1 | 1/2004 | Takigawa et al. | |
| 2004/0155340 A1 | 8/2004 | Owada et al. | |
| 2004/0213986 A1 | 10/2004 | Kim et al. | |
| 2004/0214110 A1 | 10/2004 | Kim et al. | |
| 2005/0130440 A1 | 6/2005 | Yim et al. | |
| 2005/0287790 A1 | 12/2005 | Owada et al. | |
| 2006/0204673 A1 | 9/2006 | Takayasu et al. | |
| 2006/0246737 A1 | 11/2006 | Yim et al. | |
| 2007/0231559 A1 | 10/2007 | Kim et al. | |
| 2009/0053902 A1 | 2/2009 | Yim et al. | |
| 2009/0093130 A1 | 4/2009 | Owada et al. | |
| 2009/0104541 A1 | 4/2009 | Kim et al. | |
| 2010/0221913 A1 | 9/2010 | Takayasu et al. | |
| 2011/0111604 A1 | 5/2011 | Kim et al. | |
| 2011/0204382 A1 | 8/2011 | Traut et al. | |
| 2012/0252227 A1 | 10/2012 | Owada et al. | |

FOREIGN PATENT DOCUMENTS

| | | |
|---|---|---|
| JP | 2001-060584 A | 3/2001 |
| JP | 2001-196367 A | 7/2001 |
| JP | 2002-110670 A | 4/2002 |
| JP | 2002-203899 A | 7/2002 |
| JP | 2002-252228 A | 9/2002 |
| JP | 2002-256434 A | 9/2002 |
| JP | 2002-270689 A | 9/2002 |
| JP | 2003-124307 A | 4/2003 |
| JP | 2003-218109 A | 7/2003 |
| JP | 2004-023031 A | 1/2004 |
| JP | 2004-172590 A | 6/2004 |

OTHER PUBLICATIONS

Citation 6 in Japanese Office Action dated May 8, 2007, Aurora 2.7 Process pp. 40-44 and 120; Mar. 1, 2000.

Citation 7 in Japanese Office Action dated May 8, 2007, Black Diamond pp. 88-90 and 140; May 1, 2001.

Citation 8 in Japanese Office Action dated May 8, 2007, Low-K pp. 35-40 and 120; Jul. 1, 2002.

Japanese Office Action dated May 8, 2007, issued in corresponding Japanese Patent Application No. 2003-360192.

Japanese Office Action dated Dec. 26, 2006, issued in corresponding Japanese Patent Application No. 2003-360192.

US Office Action dated Apr. 30, 2012, issued in U.S. Appl. No. 12/314,036.

* cited by examiner

FIG.1A
| PARAMETER | | CORAL | TORAL |
|---|---|---|---|
| SOURCE GAS (sccm) | TMCTS | 5.0 | 1.0 |
| | $O_2$ | 250 | 0~200 |
| | $CO_2$ | 5000 | |
| POWER (w) | HF | 600 | 300 |
| | LF | 400 | 200 |
| PRESSURE (torr) | | 4 | |
FIG.1B
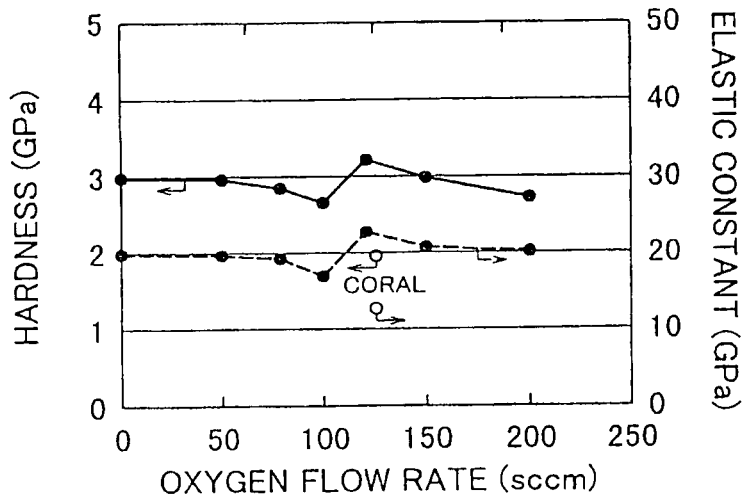
FIG.1C
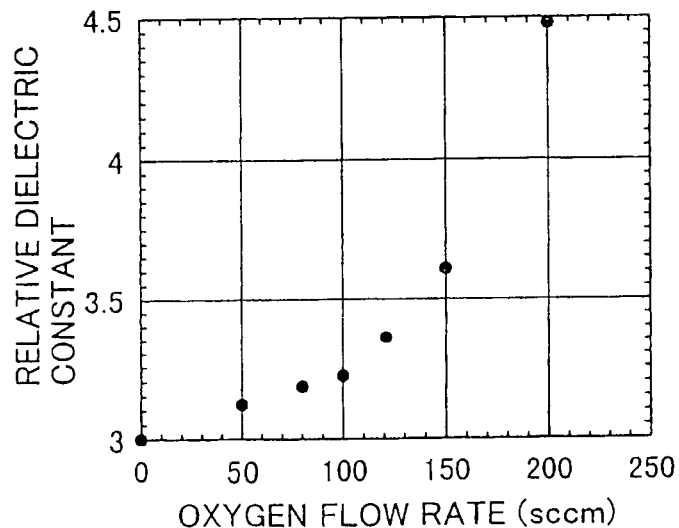

| FILM TYPE | COMPOSITION (at %) | | | |
|---|---|---|---|---|
| | H | C | O | Si |
| ESL3(SiC) | 39.0 | 19.7 | 20.3 | 21.0 |
| CORAL | 32.0 | 16.1 | 33.7 | 18.2 |
| TORAL 150 | 11 | 15 | 48 | 26 |
| TORAL 50 | 20 | 18 | 35 | 27 |
| TORAL 0 | 20 | 21 | 35 | 24 |

FIG.10

SOURCE GASES: TMCTS:1ml/min, CO₂: 5000sccm

| SAMPLE No. | PRESSURE (torr) | HF(W) | LF(W) | DEPOSITION RATE (nm/min) | THICKNESS NON-UNIFORMITY (%) | REFRACTIVE INDEX | HARDNESS (GPa) | YOUNG MODULUS (GPa) | SPECIFIC DIELECTRIC CONSTANT |
|---|---|---|---|---|---|---|---|---|---|
| 1 | 4.0 | 300 | 200 | 363 | 13.48 | 1.446 | | | |
| 2 | 3.7 | 300 | 200 | 333 | 7.11 | 1.452 | | | |
| 3 | 3.5 | 300 | 200 | 312 | 5.01 | 1.456 | 4.0 | 23.6 | 3.0 |
| 4 | 3.0 | 300 | 200 | 270 | 4.69 | 1.470 | | | |
| 5 | 3.5 | 400 | 270 | 425 | 3.21 | 1.459 | | | |
| 6 | 3.5 | 450 | 300 | 402 | 2.99 | 1.461 | 3.5 | 24.7 | 3.2 |
| 7 | 3.5 | 500 | 330 | 516 | 3.27 | 1.457 | | | |
| 8 | 3.5 | 550 | 370 | 559 | 3.29 | 1.459 | | | |
| 9 | 3.5 | 600 | 400 | 605 | 2.09 | 1.459 | 4.4 | 30.1 | 3.3 |
| 10 | 3.5 | 400 | 200 | 454 | 3.39 | 1.453 | | | |
| 11 | 3.5 | 450 | 200 | 367 | 4.76 | 1.451 | | | |
| 12 | 3.5 | 500 | 200 | 368 | 4.64 | 1.451 | | | |
| 13 | 3.5 | 550 | 200 | 377 | 2.78 | 1.450 | | | |
| 14 | 3.5 | 600 | 200 | 385 | 2.86 | 1.448 | 3.6 | 23.4 | 3.2 |
| 15 | 4.0 | 300 | 200 | 370 | 8.33 | 1.450 | | | |
| 16 | 4.0 | 600 | 0 | 89 | 6.09 | 1.404 | | | |
| 17 | 4.0 | 600 | 200 | 380 | 3.51 | 1.437 | | | |
| 18 | 4.0 | 600 | 400 | 669 | 1.80 | 1.462 | | | |
| 19 | 4.5 | 600 | 200 | 552 | 9.58 | 1.427 | | | |
| 20 | 4.5 | 800 | 200 | 649 | 3.69 | 1.424 | 2.0 | 17.3 | 2.85 |
| 21 | 4.5 | 900 | 200 | 666 | 3.96 | 1.422 | | | |
| 22 | 4.5 | 900 | 300 | 780 | 2.95 | 1.433 | | | |
| 23 | 5.0 | 1100 | 200 | 702 | 4.55 | 1.420 | | | |
| 24 | 5.0 | 1200 | 200 | 793 | 4.76 | 1.417 | | | |

*FIG.11*

| FILM | COMPOSITION (at%) | | | | SPECIFIC DIELECTRIC CONSTANT |
|---|---|---|---|---|---|
| | H | C | O | Si | |
| SiOC-A | 20 | 21 | 35 | 24 | 3.0 |
| SiOC-A:POX | 25 | 18 | 35 | 22 | 3.1 |
| SiOC-B | 27 | 18 | 34 | 21 | 2.85 |
| CORAL | 32 | 16 | 34 | 18 | 2.9 |

SILICON OXYCARBIDE, GROWTH METHOD OF SILICON OXYCARBIDE LAYER, SEMICONDUCTOR DEVICE AND MANUFACTURE METHOD FOR SEMICONDUCTOR DEVICE

CROSS REFERENCE TO RELATED APPLICATION

This application is a divisional application of U.S. application Ser. No. 13/493,244 filed on Jun. 11, 2012, which is a divisional application of U.S. application Ser. No. 12/314,036 filed on Dec. 3, 2008, now U.S. Pat. No. 8,349,722, which is a divisional application of U.S. application Ser. No. 11/206,955 filed on Aug. 19, 2005, now U.S. Pat. No. 7,485,570, which is a divisional application of U.S. application Ser. No. 10/694,826 filed Oct. 29, 2003, now U.S. Pat. No. 6,949,830, which was based on and claimed priority to Japanese Patent Application No. 2002-315900 filed on Oct. 30, 2002, the entire contents of which being incorporated herein by reference.

BACKGROUND OF THE INVENTION

A) Field of the Invention

The present invention relates generally to a low dielectric constant insulator having a low specific dielectric constant, a method of growing a low dielectric constant insulating layer, a semiconductor device having a low dielectric constant insulating layer, and a method of manufacturing a semiconductor device having a low dielectric constant insulating layer. The invention relates specifically to a low dielectric constant insulator suitable for use with a semiconductor integrated circuit having multi-layer wirings, a method of growing a low dielectric constant insulating layer, a semiconductor device having multi-layer wirings and low dielectric constant insulators, and a method of manufacturing such a semiconductor device.

B) Description of the Related Art

Semiconductor integrated circuit devices are becoming highly integrated, and there is the tendency that the scale of wirings of each device increases one generation after another. As the wiring scale becomes large, the number of wiring layers increases so that a multi-layer wiring structure is adopted. High integration of a semiconductor integrated circuit device results in a narrow wiring space.

There is the tendency that the wiring space is narrowest at lower level wiring layers and broadens toward upper level wiring layers. Many of lower level wirings are used for transmitting signals, whereas many of upper level wirings are used for power source lines. Because of this characteristic difference, the conditions required for multi-layer wirings are not the same.

A transmission speed of a signal in a wiring is governed by wiring resistance and wiring parasitic capacitance. It is desired for a high speed operation to lower a wiring resistance and reduce a wiring parasitic capacitance.

In order to lower a wiring resistance, Cu wirings are used nowadays in place of Al wirings. It is difficult to use wiring material having a resistivity lower than that of Cu. As the reduction in a wiring resistance reaches near its limit, it becomes necessary to reduce a wiring parasitic capacitance. When Cu wirings are used, a diffusion preventive film of SiN, SiC or the like is formed covering each Cu wiring in order to prevent oxidation and diffusion of Cu.

A parasitic capacitance between wirings increases if the wiring space becomes narrow assuming the same wiring thickness. The influence of a parasitic capacitance upon a device operation speed is small if the device has a wiring space of 1 μm or broader, whereas this influence becomes large if the device has a wiring space of 0.5 μm or narrower. It can be expected that if a device has a wiring space of 0.2 μm or narrower, the parasitic capacitance greatly influences the device operation speed.

The parasitic capacitance between wirings can be reduced if the wiring thickness is made thin and the confronting area of adjacent wirings is made small. However, as the wiring thickness is made thin, the wiring resistance increases so that the operation speed as a whole cannot be improved.

The most effective means for reducing the wiring parasitic capacitance is to make an insulating layer between wirings have a low dielectric constant. Insulating materials having a lower specific dielectric constant have been used in place of silicon oxide (USG) having a specific dielectric constant of about 4.1, P-doped silicon oxide (PSG) and B—P-doped silicon oxide (BPSG).

Other materials now in use include: organic insulating materials having a very low specific dielectric constant (such as SiLK (registered trademark) and FLARE (registered trademark)); and porous materials such as porous silicon oxide. These materials have characteristics largely different from those of silicon oxide and are difficult to be used as the material of an interlayer insulating film for multi-layer wirings because of their mechanical strength, reliability and the like. These materials are therefore used mainly for lower level wiring layers.

Silicon oxycarbide (SiOC) has been paid attention as another insulating material having a low specific dielectric constant. A vapor-grown silicon oxycarbide film available from Novellus Systems, Inc., called CORAL (registered trademark), is manufactured at a deposition speed of about 1000 to 1200 nm/min by plasma enhanced chemical vapor deposition (CVD) under the conditions of source gas of tetramethylcyclotetrasiloxane (TMCTS), oxygen ($O_2$) and carbon dioxide ($CO_2$), a flow rate TMCTS:$O_2$:$CO_2$=5:250:5000 (ml/min, sccm), a gas pressure of 4 torr, an HF (13.56 MHz) power of 600 W and an LF (1 MHz or lower) power of 400 W.

This insulating material called CORAL has Si—O—C as its main skeleton and a specific dielectric constant of 2.9 which is considerably lower than that of silicon oxide. This insulating material is promising as an interlayer insulating layer material for multi-layer wirings.

It has been proposed that a silicon oxycarbide layer is used partially as a hard mask layer and thereafter the silicon oxycarbide layer is left as a portion of an interlayer insulating film having a low dielectric constant (refer to Japanese Patent Laid-open Publication No. 2003-218109, family of U.S. patent application Ser. No. 10/053,288 filed on Jan. 17, 2002).

A low specific dielectric constant material is generally has low adhesion to, for example, an underlying layer formed as a diffusion preventive film for Cu. If the number of wiring layers is increased by using interlayer insulating films having low adhesion, a film peel-off occurs at the interface to the underlying layer.

It is desired that the multi-layer wiring structure uses a lamination of a plurality of low dielectric constant insulating layers having different thermal expansion coefficients. The material having a low specific dielectric constant has generally the tendency of a low density and a low mechanical strength. If there exists a mismatch of a thermal coefficient between interlayer insulating layers, a large stress is generated at the interface so that cracks may be formed in the insulating layer having a low relative dielectric factor.

SUMMARY OF THE INVENTION

An object of this invention is to prevent peel-off and cracks of interlayer insulating layers for multi-layer wirings.

Another object of the invention is to provide insulating material having a low dielectric constant suitable for use as the material of multi-layer wirings of a semiconductor device.

Still another object of the invention is to provide a method of growing a low dielectric constant insulating layer on an underlying layer.

Further object of the invention is to provide a semiconductor device of high reliability having multi-layer wirings with low dielectric constant insulating material, and a method of manufacturing such a semiconductor device.

According to one aspect of the present invention, there is provided silicon oxycarbide which contains hydrogen and has a carbon content of at least about 18 at % and a specific dielectric constant of at most about 3.1.

According to another aspect of the present invention, there is provided silicon oxycarbide whose hydrogen content is at most 30 at % and whose specific dielectric constant is at most about 3.1.

According to another aspect of the present invention, there is provided a method of growing a silicon oxycarbide layer comprising the steps of: preparing an underlying layer; and growing a silicon oxycarbide layer on the underlying layer by vapor deposition using, as source gas, tetramethylcyclotetrasiloxane, carbon dioxide gas and oxygen gas, a flow rate of said oxygen gas being at most 3% of a flow rate of the carbon dioxide gas.

According to another aspect of the present invention, there is provided a semiconductor device comprising: a semiconductor substrate; a copper wiring formed above the semiconductor substrate; a silicon carbide layer covering the copper wiring; and a first silicon oxycarbide layer covering the silicon carbide layer, the first silicon oxycarbide layer containing hydrogen and having a carbon content of at least about 18 at % (at least 17 at %) or a hydrogen content of at most 30 at %, and a specific dielectric constant of at most about 3.1.

According to another aspect of the present invention, there is provided a method of manufacturing a semiconductor device comprising the steps of: preparing an underlying structure having a semiconductor substrate, a copper wiring formed above the semiconductor substrate and a silicon carbide layer covering the copper wiring; and growing a silicon oxycarbide layer on the underlying structure by vapor deposition using, as source gas, tetramethylcyclotetrasiloxane, carbon dioxide gas and oxygen gas, a flow rate of said oxygen gas being at most 3% of a flow rate of the carbon dioxide gas.

According to another aspect of the present invention, there is provided a method of manufacturing a semiconductor device comprising the steps of: preparing an underlying structure having a semiconductor substrate, a copper wiring formed above the semiconductor substrate and a silicon carbide layer covering the copper wiring; making hydrophilic a surface of the silicon carbide layer of the underlying structure by using plasma of weak oxidizing gas which contains oxygen and has a molecular weight larger than a molecular weight of $O_2$; and forming a low dielectric constant insulating layer on the surface of the hydrophilic silicon carbide layer, the low dielectric constant insulating layer having a specific dielectric constant lower than a specific dielectric constant of silicon oxide.

SiOC having novel characteristics can be manufactured. Adhesion can be improved by depositing this SiOC on an SiC layer. It is also possible to increase a physical strength and prevent cracks and the like. By incorporating these merits, a semiconductor device having high reliability and high performance can be provided.

The surface of an SiC layer can be made further hydrophilic. An SiOC layer having the conventional structure can be formed on the surface of a enhanced hydrophilic SiC layer with enhanced adhesion.

BRIEF DESCRIPTION OF THE DRAWINGS

FIGS. 1A to 1C show a table and graphs explaining the results of experiments made by the present inventors.

FIG. 10 is a table showing the film forming conditions and measurement results of samples.

FIG. 11 is a table showing the compositions of selected samples.

DESCRIPTION OF THE PREFERRED EMBODIMENTS

Figures 2A, 2B:
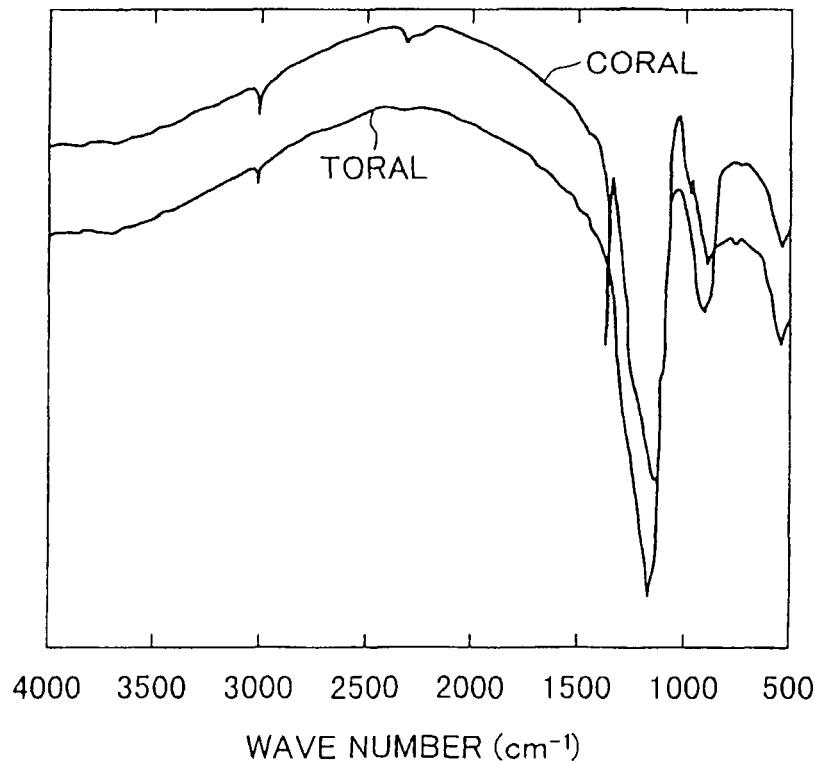
FIGS. 2A and 2B show a table and a graph explaining the results of experiments made by the present inventors.

With reference to the accompanying drawings, description will be made on the experiments made by the present inventors and the results thereof and on the embodiments of the invention.

A vapor-grown silicon oxycarbide (registered trademark CORAL) film available from Novellus Systems, Inc., has a low relative dielectric factor of about 2.9. However, it has weak adhesion to an SiC layer or the like and is rather insufficient in terms of the physical strength such as hardness and elastic constant or Young's modulus.

The present inventors have developed new CVD conditions to improve tight adhesion of a vapor-grown silicon oxycarbide film and increase the physical strength. In the following, a conventional vapor-grown silicon oxycarbide film is called CORAL, and a vapor-grown silicon oxycarbide film developed by the present inventors is called TORAL or new SiOC. TORAL or new SiOC is considered having Si—O—C as its main skeleton.

FIG. 1A is a table showing growth parameters of a CORAL film and a TORAL film. CORAL is grown by flowing, as source gas, TMCTS at 5 ml/min, $O_2$ gas at 250 sccm and $CO_2$ gas at 5000 sccm, as described earlier, under the conditions of a pressure of 4 torr, an HF power of 600 W and an LF power of 400 W.

The present inventors have tried if the physical strength can be improved by lowering a deposition speed. In order to lower the deposition speed, the flow rate of the source gas TMCTS was reduced to 1 ml/min or by one fifth, and the HF and LF powers were lowered to 300 W and 200 W or by one second, respectively. The flow rate of $O_2$ gas was reduced more than that of CORAL in the range of 0 to 200 sccm. The $O_2$ gas flow was set to 0, 50, 80, 100, 120, 150 and 200 (sccm).

The deposition speed of TORAL was lowered to 300 to 350 nm/min which is about ¼ to ⅓ that of CORAL. The density of TORAL increased apparently to about 1.6 to 1.7 as compared to the density of about 1.4 of CORAL.

FIGS. 1B and 1C are graphs showing the physical constants of TORAL films deposited in the manner described above.

FIG. 1B is a graph showing a change in hardness and elastic constant (modulus) relative to the oxygen flow rate. The abscissa of FIG. 1B represents an oxygen flow rate in the unit of sccm, and the ordinate represents hardness in the unit of GPa and the modulus in the unit of GPa. Measurement points coupled by solid lines indicate hardness data, and measurement points coupled by broken lines indicate modulus data. White circles indicate hardness and modulus of CORAL given for the purpose of comparison. The abscissa has no meaning for CORAL (because the oxygen flow rate is constant at 250 sccm).

As seen from FIG. 1B, hardness and modulus are generally constant irrespective of the $O_2$ flow rate, although they change more or less at the $O_2$ flow rates of 100 and 120 (sccm). As compared to the hardness of about 2 GPa of CORAL, the hardness of TORAL increased to about 3 GPa. The elastic constant is about 13 GPa for CORAL whereas the elastic constant for TORAL increases to about 20 GPa. TORAL increases the physical strength greatly as compared to that of CORAL. It is therefore expected that the generation of cracks is suppressed. Reducing the flow rates of source gas, TMCTS and oxygen, is effective for lowering the deposition speed and improving the physical strength.

Dependency of physical strength on the oxygen flow rate is low. From the view point of physical strength, it is considered that the flow rate of oxygen can be decreased as desired.

FIG. 1C is a graph showing a change in the specific dielectric constant with an oxygen flow rate. The abscissa represents an oxygen flow rate in the unit of sccm and the ordinate represents a specific dielectric constant. As seen from FIG. 1C, as the oxygen flow rate reduces, the specific dielectric constant lowers. At the oxygen flow rate larger than 100 sccm, particularly larger than 150 sccm, the specific dielectric constant increases remarkably. In order to maintain the specific dielectric constant low, it is preferable to set the oxygen flow rate to 150 sccm (3% of the $CO_2$ gas flow rate) or smaller, particularly to 100 sccm (2% of the $CO_2$ gas flow rate) or smaller. The specific dielectric constant is required to be 3.1 or smaller in order to satisfy the capacitance design value of devices under the technical state of current developments. TORAL satisfying this condition corresponds to samples having the oxygen flow rate of 50 sccm or the oxygen flow rate of 0. In order to set the specific dielectric constant to about 3.1 or smaller, it is preferable to set the oxygen flow rate to 50 sccm (1% of the $CO_2$ gas flow rate) or smaller. The specific dielectric constants of these samples are approximately equal to or slightly higher than the specific dielectric constant of about 2.9 of CORAL. The hardness and modulus are increased considerably as compared to those of CORAL, as shown in FIG. 1B.

FIG. 2A is a table showing the compositions of films measured by Rutherford backward scattering or the like. There exists a measurement error of ±2%. Even if the precision is raised through averaging, an error of ±1% may still exist. TORAL samples were made at the oxygen flow rates of 0, 50 and 150 (sccm). For the comparison purpose, measurements were also conducted for CORAL and ESL3 which is silicon carbide (SiC) available from Novellus Systems, Inc. A vapor-grown silicon carbide film contains Si, C and in addition a fairly large amount of H and O, Since silicon carbide has Si—C as its main skeleton, H and O are expected to be coupled to outer positions of the main skeleton.

As compared to ESL3, the silicon oxycarbide film CORAL has apparently an increased amount of oxygen and a decreased amount of other components. Silicon oxycarbide is considered having the main skeleton Si—O—C. It can be considered that although silicon carbide (ESL3) contains Si, O and C at about 20%, it has substantially no Si—O—C skeleton. As compared to the compositions of CORAL, the compositions of TORAL has an increased amount of Si, a slightly increased amount of at least O, and a decreased amount of H. As compared to CORAL, TORAL having the oxygen flow rate of 50 sccm or smaller has carbon (C) more by about 2 at % or higher and hydrogen (H) less by about 12 at %.

The composition of carbon (C) of TORAL increases as the oxygen flow rate is lowered. An increase in the C contents may be ascribed to an increased influence of $CO_2$. By considering that the oxygen flow rate is preferably set to 50 sccm in order to realize the specific dielectric constant of about 3.1, it is preferable that the composition of the carbon (C) is set to about 18 at % or larger (or 17 at % or larger). According to the experiment results, the C composition is preferably about 18 to 21 at % (17 to 22 at %). Although it can be expected that the larger the C composition, the lower the specific dielectric constant, the state that the amount of C is larger than that of Si may pose a problem of characteristics. The C composition is therefore preferably about 25 at % (26 at %) or smaller.

The composition of hydrogen (H) is about 20 at % (21 at %) which is far larger than about 32 at % of CORAL. Hydrogen is not an essential element for silicon oxycarbide, but it is the component accompanied when TMCTS is used as the source gas. Hydrogen is considered having a function of reducing cross links by terminating the bonds of Si, C and O. The amount of hydrogen contents is therefore preferably as small as possible. Even if oxygen is flowed at 150 sccm, the hydrogen composition exists at about 11 at % so that it is difficult to lower the hydrogen composition to about 11 at % or lower when the oxygen flow rate is set to 50 sccm.

FIG. 2B is a graph showing infrared absorption spectra of a CORAL film and a TORAL film. The abscissa represents a wave number in the unit of $cm^{-1}$ and the ordinate represents an absorption. Absorption, which can be considered being caused by Si—H near at a wave number of 2200 to 2300 $cm^{-1}$, can be observed clearly for CORAL, whereas such absorption is as small as it is hardly observed for TORAL. As compared to CORAL, absorption caused by C—H near at a wave number 3000 $cm^{-1}$ is reduced for TORAL. A decrease in Si—H and C—H may be ascribed to a reduction of terminated bonds and an increase in bridge density (cross links). If the cross links increase, it can be expected that the physical strength such as hardness and modulus can be improved. This expectation matches the increase in C composition and the decrease in H composition.

Although SiC to be used as a copper diffusion preventive film is hydrophilic in strict speaking, the surface of the film is rather water-repellent (hydrophobic). SiC/SiOC/SiC structures having a silicon oxycarbide film sandwiched between silicon carbide films were formed and stud-pull tests using Sebastian tester were conducted.

Figure 3:
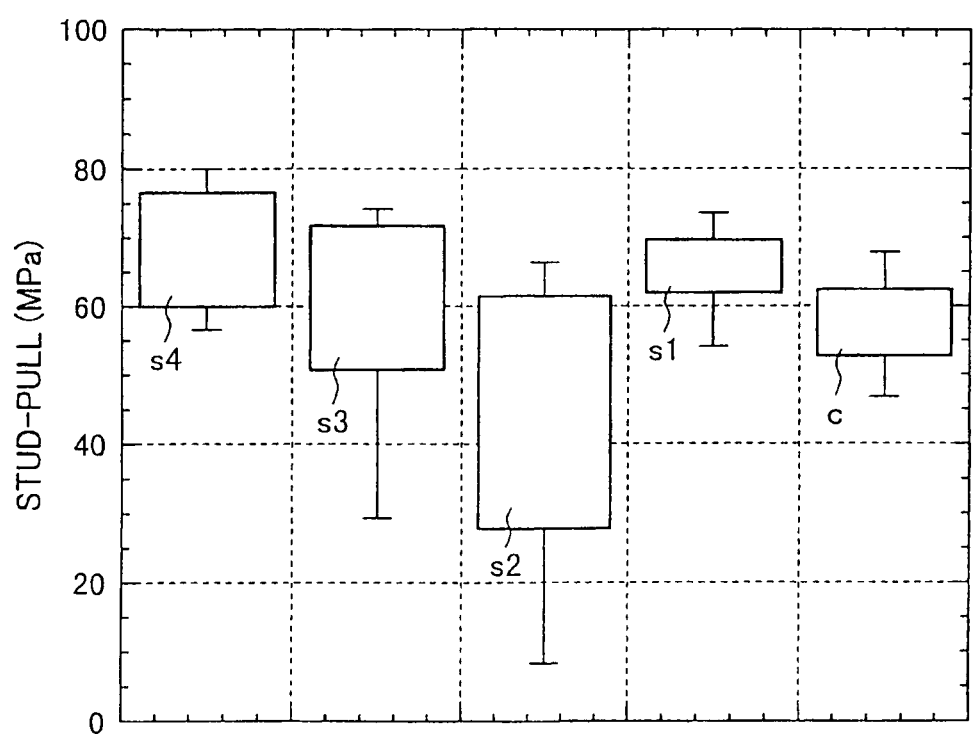
FIG. 3 is a graph showing the results of stud-pull tests checking adhesion of SiOC layers.

FIG. 3 is a graph showing the stud-pull test results. The ordinate represents a strength applied during the stud-pull test, the strength being in the unit of MPa. A sample c has a conventional CORAL layer sandwiched between SiC layers. A sample s1 has a TORAL layer in place of an SiC layer, sandwiched between SiC layers. It can be seen that the tight adhesion is improved clearly in the latter case. Although the CORAL sample had many peel-off at the interface of underlying SiC/CORAL, the TORAL sample had no peel-off at the interface.

A sample s2 has a lower SiC layer, a TORAL layer of 50 nm in thickness formed at an HF power of 90 W on the lower SiC layer, a CORAL layer formed on the TORAL layer and an SiC layer formed on the CORAL layer. In this case, it cannot be said necessarily that the tight adhesion is improved.

A sample s3 has the structure similar to that of the sample s2, but the TORAL layer was formed by raising the HF power from 90 W to 200 W. It can be said that the tight adhesion is improved fairly to the extent similar to or greater than the conventional CORAL sample. Raising the HF power applied when the TORAL layer is formed is considered preferable in order to improve the tight adhesion.

The SiC layer has a surface like a water repellent surface. It can be considered that if a silicon oxycarbide film is formed on the surface like a water repellent surface, the tight adhesion may be degraded. If the surface of an SiC layer is changed more hydrophilic, the tight adhesion is expected to be improved. In the experiments, the surface of an SiC layer was changed hydrophilic by $CO_2$ plasma. The $CO_2$ plasma process was performed by a down-flow process of microwave excited plasma under the conditions of a $CO_2$ flow rate of 5000 sccm, a pressure of 4 torr, an RF power of 100 (90 to 200) W and a process time of 5 seconds.

A sample s4 shown in FIG. 3 was formed by processing the surface of a lower SiC layer with $CO_2$ plasma (changing the surface hydrophilic), thereafter depositing a CORAL layer and depositing an SiC layer on the CORAL layer. A strength of nearly 70 MPa or larger was obtained and it can be said that the tight adhesion is improved apparently. Also in this case, peel-off at the interface SiC/CORAL was not observed.

According to the test results shown in FIG. 3, the tight adhesion is improved most when the SiC surface is subjected to a hydrophilic process by $CO_2$ plasma. This may be ascribed to the underlying SiC layer surface changed more hydrophilic.

When the underlying SiC layer surface was processed by $O_2$ plasma instead of $CO_2$ plasma, the tight adhesion was degraded. The $O_2$ plasma processing conditions were an $O_2$ flow rate of 500 sccm, a pressure of 2 torr, a power of 200 W and a process time of 2 seconds.

The result of the stud-pull test of a sample without a $CO_2$ plasma process showed a strength of 55 MPa, whereas the result of the stud-pull test of a sample with a $CO_2$ plasma process showed a strength of 70 MPa, indicating definite improvement on the tight adhesion. No peel-off was observed at the SiC/CORAL interface similar to that described above. The result of the stud-pull test of the sample subjected to the $O_2$ plasma process showed a degraded tight adhesion of 45 MPa. Peel-off was observed mainly at the SiC/CORAL interface. This may be ascribed to that excessive oxidation by the $O_2$ plasma process degrades the tight adhesion due to surface decomposition.

In order to perform a plasma process without excessive oxidation, it may be preferable to use a down-flow process of microwave excited plasma or other processes.

When the oxygen flow rate is reduced to 0 to 50 sccm when a TORAL layer is formed, plasma of the source gas in a chamber contains a decreased $O_2$ composition and a relatively increased $CO_2$ composition. It can be considered in other words that plasma of the source gas becomes approximately $CO_2$ plasma. It may be considered that high tight adhesion of the TORAL film to the SiC film matches high tight adhesion of the SiC film subjected to the $CO_2$ plasma process to the CORAL film formed on the SiC film. Good results can be obtained by using plasma of gas which contains $CO_2$ and does not contain oxygen or plasma with an oxygen flow rate restricted small relative to a $CO_2$ flow rate.

It can be considered from these results that it is effective for tight adhesion improvement to gently oxidize the near-water-repellent or water repellent surface of an SiC film or the like. From the fact that $O_2$ plasma showed bad results and $CO_2$ plasma showed good results, it can be considered preferable to process the surface by plasma of gas which has a molecular weight larger than that of $O_2$ and contains oxygen. Gas of $NO_2$ or the like may be used in addition to $CO_2$.

Studies made by the present inventors have been directed further to the conditions of forming a silicon oxycarbide film having a proper physical strength and a low specific dielectric constant by selecting the plasma CVD conditions.

Figure 9:
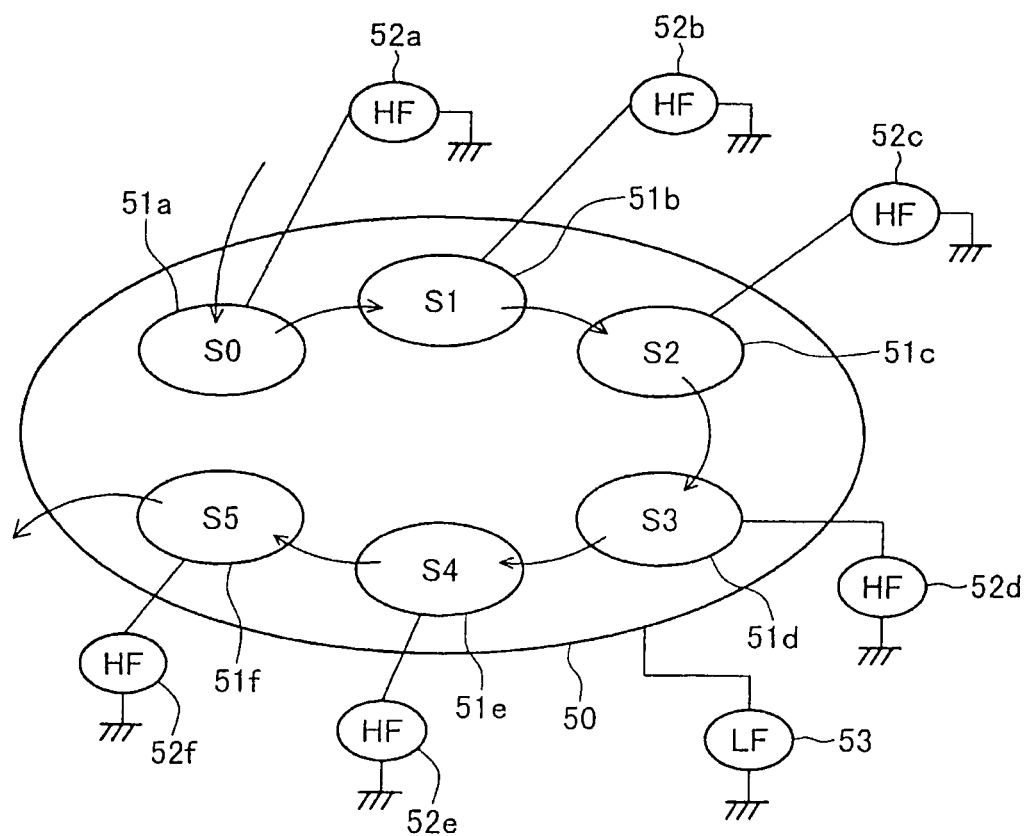
FIG. 9 is a perspective view schematically showing the structure of a plasma CVD system.

FIG. 9 is a schematic diagram showing the structure of a plasma CVD system used. A lower electrode 50 severs also as a susceptor for placing thereon six 8-inch wafers. The susceptor is provided with a transport mechanism for transporting each wafer. Six upper electrodes 51a, 51b, 51c, 51d, 51e and 51f are disposed facing the lower electrode 50 to constitute six pairs of diode parallel plate electrodes. These parallel plate electrodes constitute six stages S0 to S5.

The upper electrodes are connected to high frequency (HF) power sources 52a, 52b, . . . , 52f, respectively. The lower electrode 50 is connected to a high frequency power source 53 having a frequency (LF) lower than the high frequency (HF). The upper electrodes also have the function of shower heads for supplying source gas. The lower electrodes 50 contain heater blocks. When a high frequency power is supplied to all the stages, the total high frequency power is equally divided to six parts and supplied to the respective stages. It is also possible to supply high frequency power selectively to a selected stage. By applying a predetermined high frequency voltage between the lower electrode 50 and a predetermined upper electrode 51, plasma can be generated above a predetermined wafer.

A transported wafer is placed on a first stage under the first upper electrode 51a and undergoes a proper process. Thereafter, the wafer undergoes processes sequentially at a second stage S1, a third stage S2, a fourth stage S3, a fifth stage S4 and a sixth stage S5, and thereafter is ejected out. Experiment results of silicon carbide films will be described which were subjected to the same process at each stage. Unless specifically denoted, the amounts of gas supply and high frequency power are total values for six stages.

FIG. 10 shows the conditions and results of each experimental sample. Some samples are excluded which have a large irregularity of film thickness. Source gas used is TMCTS of 1 ml/min, ($O_2$: 0 sccm) and $CO_2$ of 5000 sccm for all samples. A deposition speed, an irregularity of intra-wafer film thickness and a refractive index were measured by changing a chamber inner pressure, a high frequency power HF applied to the upper electrode and a high frequency power LF applied to the lower electrode. The irregularity of film thickness was measured at 49 points of each wafer and represented by % of a half of a difference between maximum and minimum average values. There is a relation that a square of a complex refractive index (n+ik) is equal to the complex dielectric constant. The refractive index n is measured as a physical quantity having a close relation to the dielectric factor. The refractive index n is, however, measured at a frequency of light which is greatly different from a frequency of an electric signal at which the dielectric constant is measured.

A sample 1 uses TORAL formed at the oxygen flow rate of 0 described above. The chamber inner pressure is gradually lowered at the same HF and LF powers to obtain samples 1 to 4. As the chamber inner pressure is lowered, the deposition speed gradually lowers. This may be ascribed to that as the pressure lowers, the amount of source gas supplied to the wafer reduces. As the deposition speed lowers, the irregularity of film thickness reduces and the regularity is improved. The refractive index gradually increases as the deposition speed lowers.

Paying attention to the sample 2 which has a relatively good regularity of film thickness, not so large an increase in refractive index and a good stability of plasma, a hardness, a modulus and a specific dielectric constant were measured. According to the experiment results, the sample 1 has the hardness of 3, modulus of about 20 GPa and specific dielectric constant of about 3.0. The hardness of the sample 3 increases to about 4.0 and the modulus increases to about 23.6. The specific dielectric constant maintains about 3.0. It can be said that the sample 3 is an excellent low dielectric constant insulating layer having an increased physical strength and maintaining the same specific dielectric constant, as compared to the sample 1. In the following, this novel SiOC is called SiOC-A.

For samples 5 to 9, the pressure was fixed to 3.5 torr and HF and LF powers were raised. As both the HF and LF powers are raised, the deposition speed gradually increases, excepting the sample 6. It appears that there is no definite rules of the film thickness irregularity and refractive index. The physical properties of the samples 6 and 9 were measured by taking into consideration the plasma stability and the like. The sample 6 has a hardness of 3.5, a Young's modulus of 24.7 and a specific dielectric constant of 3.2. The sample 9 has a hardness of 4.4, a Young's modulus of 30.1 and a specific dielectric constant of 3.3. Although the physical strength of the hardness and Young's modulus is superior to that of TORAL, the application field of a low dielectric constant insulating film may be restricted at a specific dielectric constant of 3.2 or larger. It can be supposed that if the high frequency power is simply raised, the specific dielectric constant increases.

For samples 10 to 14, the chamber inner pressure is fixed to 3.5 torr, the LF power applied to the lower electrode is fixed to 200 W and only the HF power applied to the upper electrode is raised to 600 W starting from 400 W. Although the sample 10 shows exceptionally a high deposition speed and a low film thickness irregularity, the samples 11 to 14 gradually increase the deposition speed as the HF power is raised. The film thickness irregularity is low particularly for the samples 13 and 14. It seems there is the tendency that the refractive index lowers as the HF power is raised. The refractive index is low particularly for the sample 14. The physical properties of the sample 14 were a hardness of 3.6 GPa, a Young's modulus of 23.4 GPa and a specific dielectric constant of 3.2. Although the hardness and Young's modulus are high, the specific dielectric constant is also high so that the application field of a low dielectric constant insulating layer is restricted.

For samples 15 to 18, the chamber inner pressure is fixed to 4.0 torr and the HF and LF powers are changed. Although the sample 15 is formed in the same conditions as those of the sample 1, the deposition speed is slightly high and the film thickness irregularity is reduced. This is considered to show a kind of variation in a process of the same condition. For the samples 16 to 18, the HF power applied to the upper electrode is fixed to 600 W and the LF power is changed from 0, 200 to 400 W. For the sample 16, the LF power applied to the lower electrode is set to 0. The deposition speed considerably lowers to 89. The samples 16, 17 and 18 show an abrupt increase in deposition speed and a reduced film thickness irregularity as the LF power is raised. It seems that the refractive index increases as the deposition speed increases. It can be understood that the LF power applied to the lower electrode greatly influences film formation.

For samples 19 to 22, the chamber inner pressure is increased to 4.5 torr. For the samples 19 to 21, the LF power applied to the lower electrode is fixed to 200 W and the HF power applied to the upper electrode is raised from 600, 800 to 900 W. As the HF power applied to the upper electrode is raised, the deposition speed increases. As compared to the sample 19, the samples 20 and 21 reduce the film thickness irregularity considerably. The samples 19 to 21 have the refractive index lower than that of the samples 1 to 18. The physical properties of the sample 20 having a low film thickness irregularity and an excellent plasma stability were measured, which showed a hardness of 2.0, a Young's modulus of 17.3 and a specific dielectric constant of 2.85. Although the hardness of 2.0 is almost equal to that of CORAL, the Young's modulus of 17.3 is superior to that of CORAL and the specific dielectric constant of 2.85 is lower than that of CORAL. Since the specific dielectric constant is low and the Young's modulus is improved, this low dielectric constant insulating layer is expected to be used in various application fields. In the following description, this novel SiOC is called SiOC-B.

For a sample 22, the LF power applied to the lower electrode is raised by 100 W more than that of the sample 21. The deposition speed increases largely, and the refractive index increases although the film thickness regularity is good.

For samples 23 and 24, the chamber inner pressure is increased further to 5.0 torr and the LF power applied to the lower electrode is set to 200 W. The HF power applied to the upper electrode was set to 1100 W and 1200 W. As the HF power is raised, although the deposition speed increases and the film thickness irregularity increases, the refractive index lowers gradually.

It has been found that an insulating layer having a low specific dielectric constant can be formed by using TMCTS and $CO_2$ without using oxygen. The samples 3 and 20 among others have a low specific dielectric constant and provide excellent low dielectric constant insulating layers. The sample 3 is, however, associated with some instability of a plasma state so that particles are deposited on the wafer due to flowing source gas when the plasma is being quenched or extinguished.

To avoid this, following the plasma CVD process, only $CO_2$ gas was supplied to generate $CO_2$ plasma to terminate the plasma CVD and slightly oxidize the CVD film surface by switching over plasma CVD to $CO_2$ plasma treatment. The $CO_2$ plasma generation conditions are a $CO_2$ flow rate of 5000 sccm, a pressure of 1 torr and an HF power of 150 W. Several ten thousands of particles having a diameter of 0.1 μm are deposited on a wafer of the sample 3 having a diameter of 20 cm. However, by generating $CO_2$ plasma at the time of plasma quenching, the number of particles having a diameter of 0.1 μm was able to be reduced to several hundreds, and in better conditions, to about 100 particles. In the plasma CVD system shown in FIG. 9, the SiOC film is deposited at six stages. The $CO_2$ plasma process was performed at each stage following the deposition of the SiOC film.

The compositions of films were measured, the films including a film SiOC-A made of the sample 3, a film SiOC-A:POX made of a film formed under the same conditions as those of the sample 3 and subjected to $CO_2$ plasma at the time of plasma quenching, and a film SiOC-B made of the sample 20. The composition measurement precision has an approximate error of ±2 at %.

FIG. 11 is a table showing the compositions of the films SiOC-A, SiOC-A:POX and SiOC-B, with those of CORAL. The specific dielectric constants are also shown. SiOC-A has the same compositions as those of TORAL at the oxygen flow rate of 0. As compared to SiOC-A, SiOC-B reduces carbon and silicon by 3 at % and increases hydrogen by 7 at %. It appears that there exists the phenomenon different from the carbon composition dependency of TORAL observed when the oxygen flow rate is lowered. A possibility of existence of a different phenomenon cannot be negated because the pressure is set higher and the HF power is raised much higher than those of SiOC-A. As compared to CORAL, the pressure and HF power are raised and the LF power is lowered.

As compared to SiOC-A, it can be considered that cross links are reduced due to an increase in hydrogen and the mechanical strength is lowered. However, as compared to CORAL, the hydrogen contents are remarkably small (about 5 at %) and the carbon contents are large by about 2 at %. The measured carbon content values were 17.8 and 17.9. When the measurement errors are considered, these measurement values fall in the above-described preferable range of about 18 at % or higher (17 at % or higher). It can be said that the carbon contents are larger than those of CORAL by about 1 at % or larger. The mechanical strength is higher than that of CORAL and the specific dielectric constant of 2.85 is lower than that of CORAL.

The hydrogen composition is about 27 at % which is apparently lower than about 32 at % of CORAL. This is considered corresponding to the mechanical strength far more excellent than CORAL. Silicon oxycarbide can therefore be realized which has the hydrogen composition of about 27 at % or smaller (28 at % or smaller) and is excellent in the mechanical strength and has a specific dielectric constant of about 3.1 or smaller. Low dielectric constant silicon oxycarbide is expected to be realized at a hydrogen composition of about 29 at % or smaller (30 at % or smaller), which silicon oxycarbide has a mechanical strength superior to that of CORAL and a specific dielectric constant of about 3.1 or smaller.

SiOC:POX is obtained by growing SiOC-A and thereafter processing the SiOC-A surface by a $CO_2$ plasma process for 2 seconds at each of the six stages shown in FIG. 9. The compositions of SiOC-A:POX is considered the same as those of SiOC-A. The measured compositions are considerably different from those of SiOC-A. This may be ascribed to absorption of water contents or the like in the oxidized surface layer after SiOC-A:POX is exposed to the atmospheric air. Although the specific dielectric constant increases, the number of particles on the wafer surface is reduced greatly.

Figure 12:
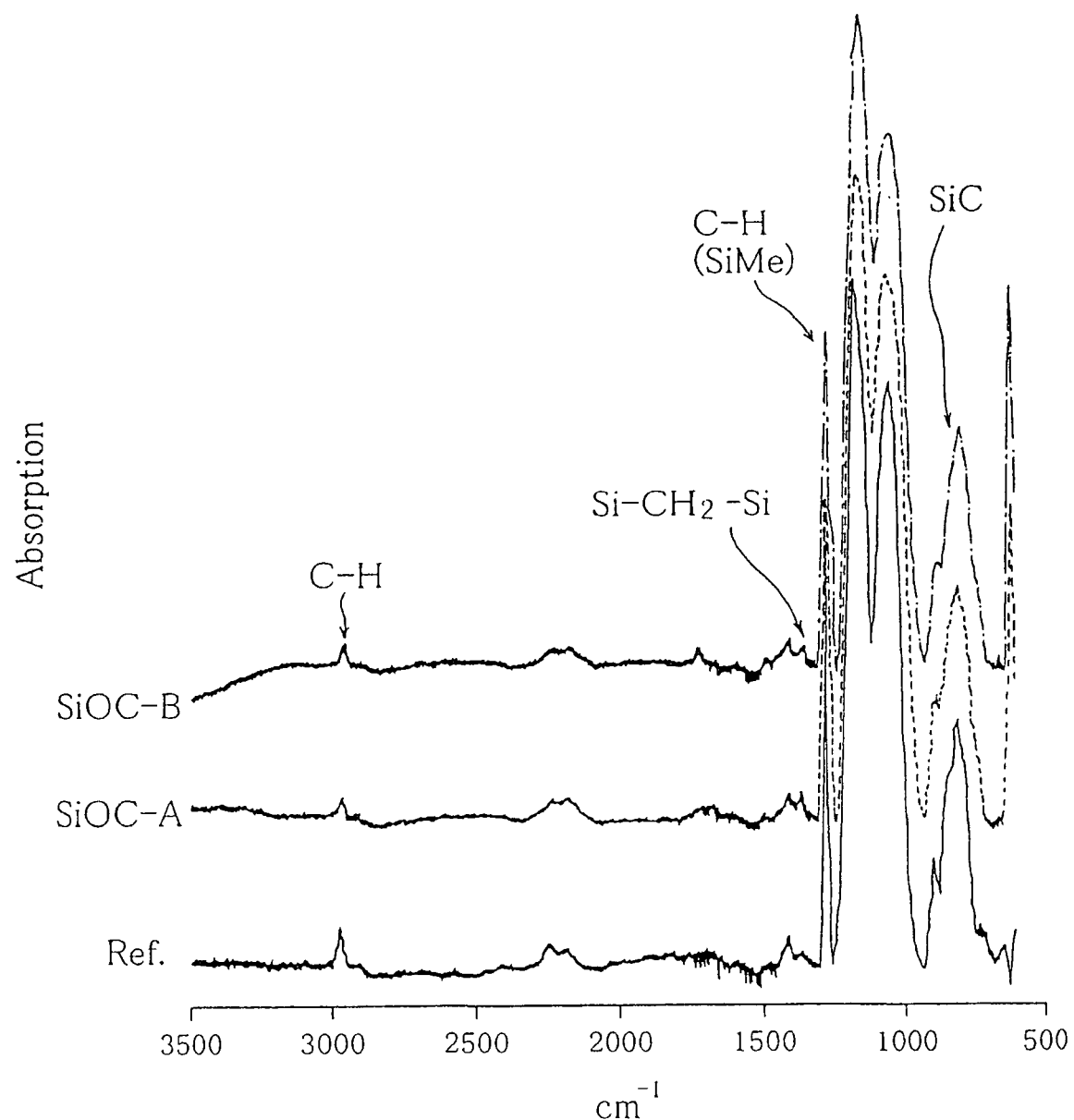
FIG. 12 is a graph showing infrared absorption spectra of selected samples.

FIG. 12 is a graph showing spectra of infrared absorption of SiOC-A and SiOC-B, being compared to infrared absorption of a reference (CORAL). The abscissa represents a wave number in the unit of $cm^{-1}$ and the ordinate represents an absorption. As compared to the reference Ref, C—H absorption reduces near at the wave number of 3000 $cm^{-1}$. Similarly, C—H absorption reduces also near at the wave number of 1270 $cm^{-1}$. Conversely, Si—$CH_2$—Si absorption near at 1360 $cm^{-1}$ increases more than that of the reference Ref. It can be understood from these absorption spectra that as compared to the reference Ref, SiOC-A and SiOC-B have an increased umber of C—H bonds and a decreased number of cross links. It can be considered that an increase in cross links improves the physical strength.

FIGS. 4A to 4D are cross sectional views illustrating a manufacture method for a semiconductor integrated circuit device according to an embodiment of the invention.

Figure 4A:
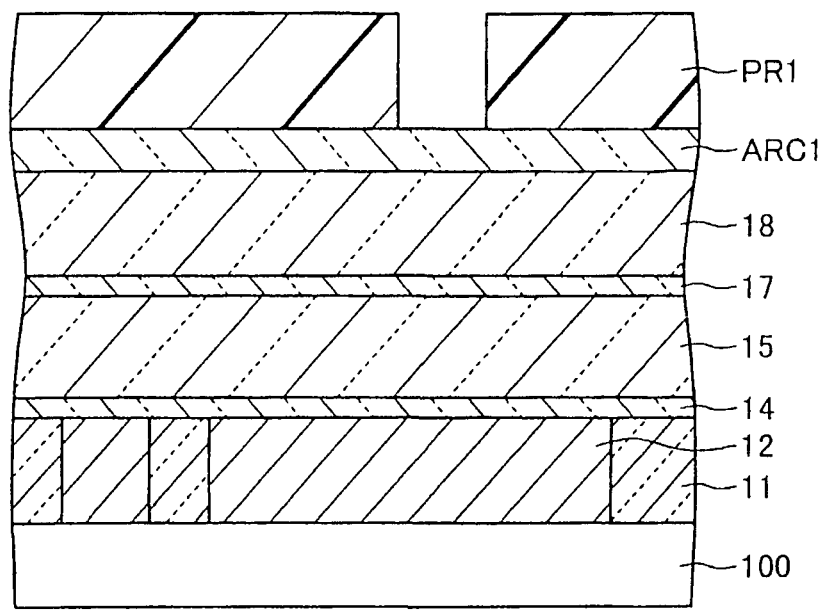
FIGS. 4A to 4D are cross sectional views of a semiconductor substrate illustrating the processes of forming a multi-layer wiring structure of a semiconductor integrated circuit device according to an embodiment of the invention.

As shown in FIG. 4A, after an element isolation region, an element structure including MOS transistors, and the like are formed on a silicon substrate 100, a phosphosilicate glass (PSG) layer 11 is formed by vapor deposition to a thickness of about 1.5 μm at a substrate temperature of 600° C. The surface of the PSG layer 11 is planarized by chemical mechanical polishing (CMP) and thereafter a resist layer is deposited on the surface of the PSG layer 11 to form a resist pattern having electrode lead openings. By using the resist pattern as a mask, the PSG layer 11 is etched to form via holes exposing the contact areas on an underlying region. The resist pattern is removed thereafter. After a barrier layer such as Ti or the like is formed, a W layer is formed by CVD or the like to bury the electrode lead via holes. The W layer and the like deposited on the PSG layer 11 are removed by CMP to form tungsten plugs 12.

An SiC layer 14 as an etch stopper layer is formed to a thickness of about 70 nm, covering the tungsten plug 12, the etch stopper layer having an oxygen shielding function and being made of ESL3 (registered trademark) of Novellus Systems, Inc. Next, a silicon oxycarbide (SiOC) layer 15 of TORAL is deposited to a thickness of 550 nm. The oxycarbide layer 15 having improved tight adhesion and physical strength is therefore formed on the SiC layer 14.

An SiC layer 17 functioning as a middle stopper layer is deposited on the surface of the SiOC layer 15 to a thickness of about 30 nm, the SiC layer being made of ESL2 (registered trademark) of Novellus Systems, Inc. An SiC layer 18 of TORAL is deposited on the SiC layer 17 to a thickness of about 370 nm. The SiOC layer 18 has also improved tight adhesion to the SiC layer 17 and having improved physical strength. An antireflection film ARC1 is formed on the surface of the SiC layer 18.

On this antireflection film ARC1, a photoresist layer PR1 having a via hole opening pattern is formed. By using the photoresist pattern PR1 as an etching mask, the antireflection film ARC1, SiOC layer 18, SiOC layer 17 and SiOC layer 15 are etched.

Figure 4B:
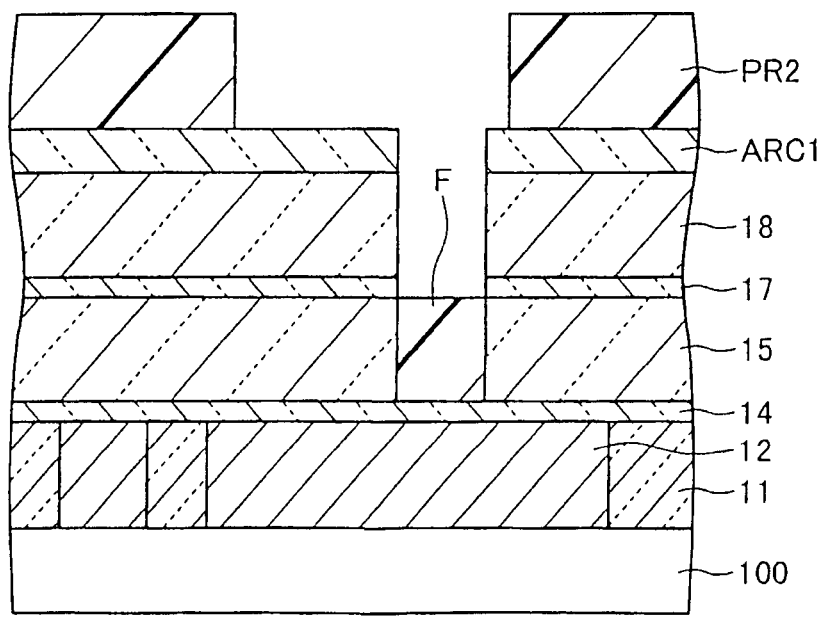

As shown in FIG. 4B, the photoresist pattern PR1 is removed and a photoresist layer PR2 having a wiring pattern opening is newly formed. A filler F is buried in a via hole already formed. The filler F is made of resist material removed with photosensitivity. By using the photoresist layer PR2 having the wiring pattern opening as an etching mask, the antireflection film ARC1 and SiOC layer 18 are etched. Thereafter, the photoresist pattern PR2 and filler F are removed and the exposed SiC layers 17 and 14 are selectively etched to thereby form a dual damascene trench.

Figure 4C:
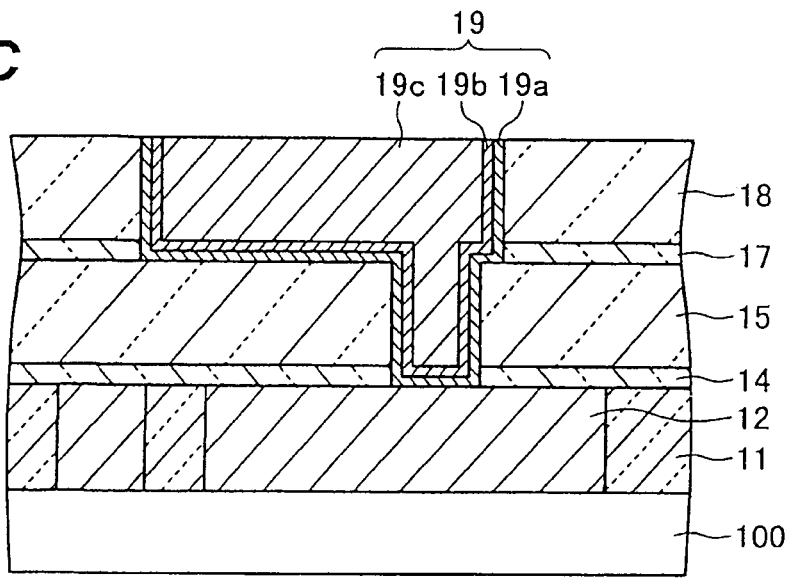

As shown in FIG. 4C, a TaN barrier layer 19a of about 30 nm in thickness and a Cu seed layer 19b of about 30 nm in thickness are formed by sputtering on the inner surface of the dual damascene trench. The Cu seed layer 19b is used for plating Cu thereon. On the surface of the Cu seed layer 19b, a Cu layer 19c is plated. In this manner, the dual damascene trench is filled with copper wiring. An unnecessary Cu layer and the like deposited on the SiOC layer (including the antireflection film ARC1) are removed by CMP. In this case, the antireflection film ARC1 can be used as a stopper. The antireflection film is also removed by the CMP or etching.

Figure 4D:
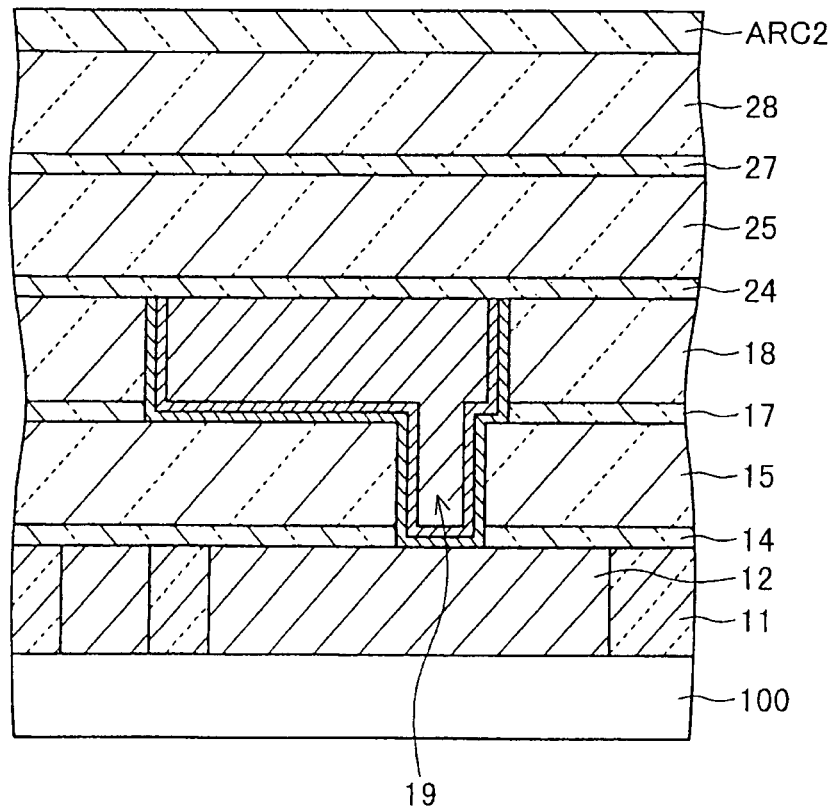

As shown in FIG. 4D, an SiC layer 24 of ESL3 (registered trademark) of Novellus Systems, Inc. is formed to a thickness of about 70 nm, covering the Cu wiring 19. This SiC layer has a function of a copper diffusion preventive film.

An SiOC layer 25 of TORAL similar to that described earlier is formed to a thickness of about 550 nm as an interlayer insulating film for an upper wiring. On this SiOC layer 25, an SiC layer 27 is formed to a thickness of about 30 nm, and an SiOC layer 28 of TORAL is formed to a thickness of about 370 nm on the SiC layer 27. On the surface of the SiOC layer 28, an antireflection film ARC2 is formed to complete a lamination structure. By performing the processes similar to those shown in FIGS. 4A, 4B and 4C, a dual damascene wiring is formed buried in the interlayer insulating films 24, 25, 27 and 28.

If necessary, similar processes are repeated to form the necessary number of wiring layers. An interlayer insulating film of silicon oxide is formed and aluminum (Al) pads are formed thereon. With this structure, a wiring having a capacitance of 180 fF/mm was able to be formed, for example, in the second wiring layer. Whether there is any film peel-off was checked by repeating heat treatment for 30 minutes at 400° C. five times. Film peel-off was not observed at all.

Heat cycle tests were conducted for a multi-layer wiring structure made of pairs of an SiC layer and a conventional silicon oxycarbide film (of CORAL (registered trademark) of Novellus Systems, Inc.) formed on the SiC layer and having the same film thickness as that of the embodiment structure. Peel-off was observed between the underlying SiC layer and the CORAL layer.

Other novel silicon oxycarbide films may also be used.

As a modification, a multi-layer structure was formed by using an SiOC-A layer having a thickness of 350 nm as the silicon oxycarbide layers 15 and 25 and an SiOC-A layer having a thickness of 550 nm as the silicon oxycarbide layers 18 and 28. The SiOC-A forming conditions are a TMCTS flow rate of 1 ml/min, a $CO_2$ flow rate of 5000 sccm, a pressure of 3.5 torr, an HF power of 300 W and an LF power of 200 W. Also with this multi-layer structure, film peel-off was not observed at all even if heat treatment for 30 minutes at 400° C. was repeated five times. The capacitance of the second wiring layer was about 180 fF/mm. At the interface between an oxycarbide layer made of CORAL of Novellus Systems, Inc. and the underlying SiC layer, peel-off was observed after heat cycle tests.

When SiOC-A is manufactured, the chamber inner pressure is relatively low, 3.5 torr, and plasma is likely to become unstable. Particles are likely to be formed at the time of plasma quenching. At the time of plasma quenching, the supply of source gas is stopped and $CO_2$ gas is introduced to generate $CO_2$ plasma for 2 seconds. It is possible in this manner to prevent particles from being generated. Although there is a possibility that a specific dielectric constant increases slightly, an insulating layer without particles can be formed.

In the above-described modification, after each SiOC-A film is formed, in six-stage SiOC deposition process, the surface of the SiOC film was processed for 2 seconds at each plasma quenching by using $CO_2$ plasma generated under the conditions of a $CO_2$ flow rate of 5000 sccm, a pressure of 1 torr and an HF power of 150 W. In other words, the SiOC films 15, 18, 25, and 28 are formed of SiOC-A:POX. Also in this case, film peel-off was observed not at all after repeating heat treatment for 30 minutes at 400° C. for five times. The capacitance of the second wiring layer measured was about 180 fF/mm.

SiOC-B may also be used. For example, in the modification, as the silicon oxycarbide layers 15, 18, 25 and 28, a silicon carbide layer of SiOC-B was used which was manufactured under the conditions of a TMCTS flow rate of 1 ml/min, a $CO_2$ flow rate of 5000 sccm, a pressure of 4.5 torr, an HF power of 800 W and an LF power of 200 W. The capacitance of the second wiring layer measured was about 180 fF/mm. Film peel-off was observed not at all after repeating heat treatment for 30 minutes at 400° C. for five times.

When SiOC-B is manufactured, the chamber inner pressure is relatively high so that plasma can be made stable and the generation of particles can be suppressed. In addition, the specific dielectric constant can be lowered further, which is effective for reducing the capacitance between wirings.

In the above embodiment, the interlayer insulating film other than the etch stopper layer (copper diffusion preventing film) is made of the silicon oxycarbide layer of TORAL. The TORAL layer may be used as an intermediate layer combined with other layers. The material of the TORAL layer may be silicon oxycarbide formed at an oxygen flow rate of 50 to 0 sccm.

Figure 5A:
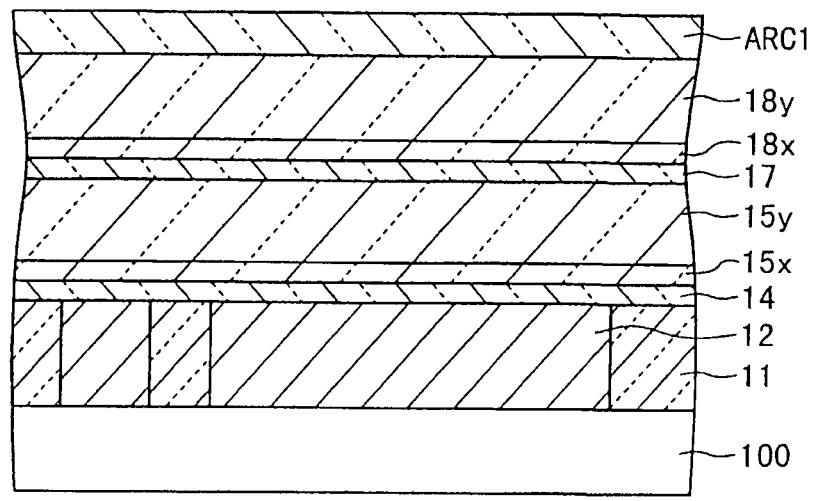
FIGS. 5A and 5B are cross sectional views of a semiconductor substrate illustrating the processes of forming multi-layer wirings according to another object of the invention.
Figure 5B:
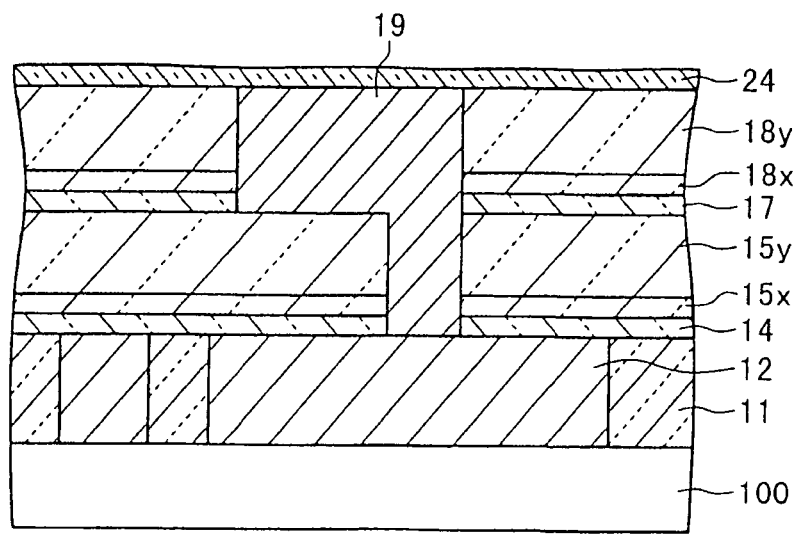

FIGS. 5A and 5B are cross sectional views illustrating a wiring forming process for a semiconductor integrated circuit device according to another embodiment of the invention.

As shown in FIG. 5A, on the surface of a silicon substrate 10, an interlayer insulating film 11 and a lower wiring 12 respectively made of PSG similar to the embodiment described above are formed. An etch stopper SiC layer 14 is formed to a thickness of about 50 nm by using ESL3 (registered trademark) of Novellus Systems, Inc, the SiC layer covering the surface of the lower level wiring 12.

On the SiC layer 14, an SiOC layer 15x of TORAL is deposited to a thickness of about 50 nm. As described earlier, this SiOC layer 15x has improved tight adhesion to the underlying SiC layer. On the SiOC layer 15x of TORAL, an SiOC layer 15y of CORAL similar to a conventional example is formed to a thickness of about 500 nm. Next, an SiC layer 17 as a middle stopper is formed to a thickness of about 30 nm by using ESL2 (registered trademark) of Novellus Systems, Inc. On this SiC layer, an SiOC layer 18x of TORAL is formed as a liner to a thickness of about 50 nm. On the SiOC layer 18x of TORAL, an SiOC layer 18y of CORAL is formed to a thickness of about 320 nm. On the SiOC layer 18y, an antireflection film ARC1 of SiN or the like is formed.

Thereafter, similar to the processes shown in FIGS. 4A to 4C, a dual damascene trench is formed by photoresist mask forming and etching processes.

As shown in FIG. 5B, a TaN layer and a Cu seed layer are formed by sputtering on the inner surface of the dual damascene trench, and a Cu layer 19 is plated on the Cu seed layer. By planarizing the surface of the Cu layer by CMP, a dual damascene copper wiring 19 is formed. An SiC layer 24 as a copper diffusion preventive layer is formed covering the copper wiring 19, the SiC layer having a thickness of 70 nm and being made of ESL3 of Novellus Systems, Inc.

Processes similar to the above processes are repeated to form a desired number of wiring layers. The capacitance of, e.g., the second wiring layer of the multi-layer structure constructed as above was about 180 fF/mm.

Whether there is any film peel-off was observed by repeating heat treatment for 30 minutes at 400° C. five times. Film peel-off was observed not at all.

Other novel SiOC materials may be used in place of TORAL. A silicon oxycarbide layer having a thickness of 50 nm and made of SiOC-A was used as the SiOC layers 15x and 18x. The parasitic capacitance of the second wiring layer of the multi-layer structure was about 180 fF/mm. Film peel-off was observed not at all after repeating heat treatment for 30 minutes at 400° C. five times.

It has been found that the tight adhesion can be improved by interposing an SiOC layer of TORAL or SiOC-A between the SiOC layer of CORAL and the SiC layer as the underlying etch stopper layer.

In this embodiment, on the surface like a water repellent surface of the SiC layer having the copper diffusion preventive function, the SiOC layer of TORAL is formed to form a multi-layer wiring structure having improved tight adhesion between the SiC and SiOC layers.

Tight adhesion can be improved also by the surface processing of an SiC layer.

Figure 6A:
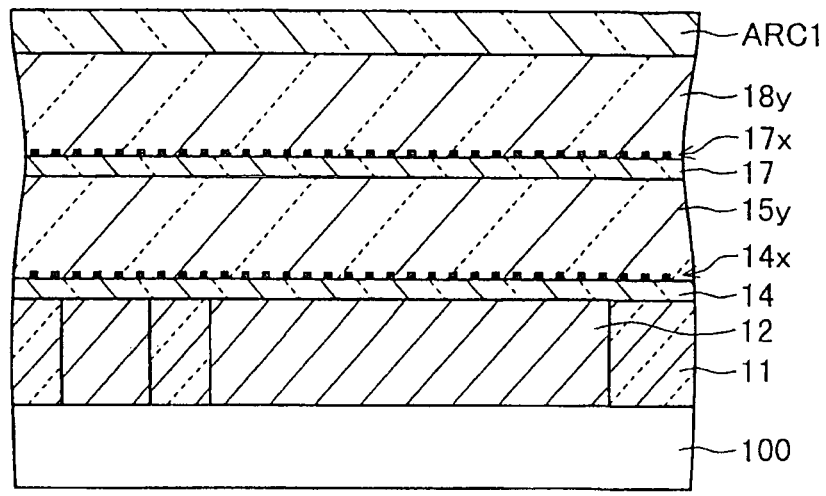
FIGS. 6A and 6B are cross sectional views of a semiconductor substrate illustrating the processes of forming multi-layer wirings according to still another embodiment of the invention.
Figure 6B:
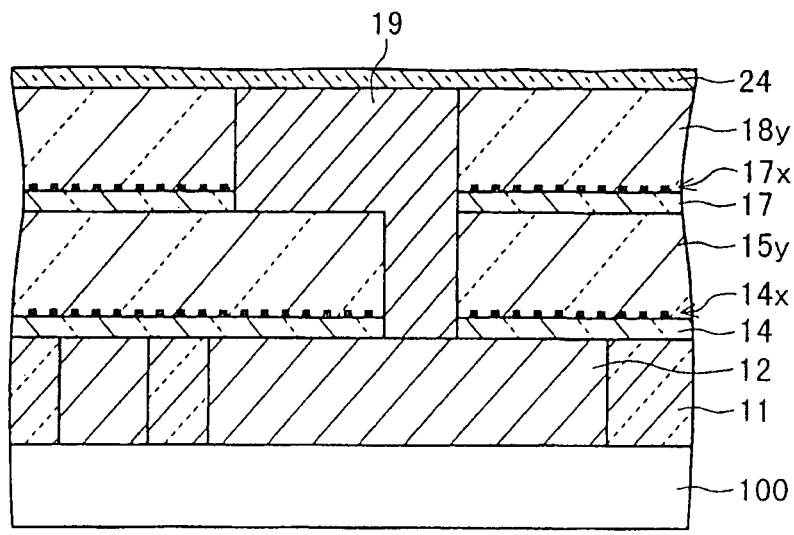

FIGS. 6A and 6B are cross sectional views of a silicon substrate illustrating the process of forming a multi-layer wiring structure of a semiconductor integrated circuit device according to a further embodiment of the invention. Similar to the embodiment described above, an interlayer insulating film 11 and a lower wiring 12 are formed on the surface of a semiconductor substrate 10. An SiC layer 14 having a thickness of about 70 nm and made of ESL3 (registered trademark) of Novellus Systems, Inc. is formed covering the surface of the lower wiring 12. The surface of the SiC layer 14 is subjected to a process using $CO_2$ plasma. By using the CVD system shown in FIG. 9, the $CO_2$ process was performed at the first stage S0. The process conditions were a $CO_2$ flow rate of 5000 sccm, a pressure of 4 torr, an RF power of 200 W and a process time of 5 seconds. It can be considered that this plasma process forms a hydrophilic surface 14x on the surface of the SiC layer 14.

On the hydrophilic surface of the SiC layer 14, an SiOC layer 15y is formed to a thickness of about 550 nm by using CORAL (registered trademark) of Novellus Systems, Inc. On this SiOC layer 15y, an SiC layer 17 as a middle stopper is formed to a thickness of about 30 nm by using ESL2 (registered trademark) of Novellus Systems, Inc. The surface of the SiC layer 17 is processed by $CO_2$ plasma, similar to that described before, to form a hydrophilic surface 17x. On this hydrophilic surface 17x, an SiOC layer 18y of CORAL of Novellus Systems, Inc. is formed to a thickness of about 370 nm. On the surface of the SiOC layer 18y, an antireflection film ARC1 of SiN or the like is formed.

Thereafter, photolithography, etching and the like are performed in a manner similar to the above-described embodiment to form a dual damascene trench.

As shown in FIG. 6B, a TaN layer and a Cu seed layer are formed on the inner surface of the dual damascene trench by sputtering to a thickness of about 30 nm, respectively. A Cu layer is plated on the Cu seed layer. An unnecessary wiring layer on the surface of the SiOC layer 18y is removed by CMP or the like to complete a dual damascene copper wiring 19. An SiC layer 24 as a copper diffusion preventive layer is formed covering the copper wiring 19, to a thickness of 70 nm by using ESL3 of Novellus Systems, Inc.

Similar to the above-described embodiment, the necessary number of wiring layers is formed by repeating similar processes. The capacitance of, for example, the second wiring layer of the multi-layer structure constructed as above was about 180 fF/mm. Film peel-off was observed not at all after repeating heat treatment for 30 minutes at 400° C. five times.

In the multi-layer wiring structure, it is desired in some cases that as the material of the interlayer insulating film for lower wiring layers having a high wiring density, an organic insulating film (e.g., SiLK (registered trademark) having a specific dielectric constant of about 2.6) is used in place of SiOC having a specific dielectric constant of about 2.9 to 3.1.

Figure 7:
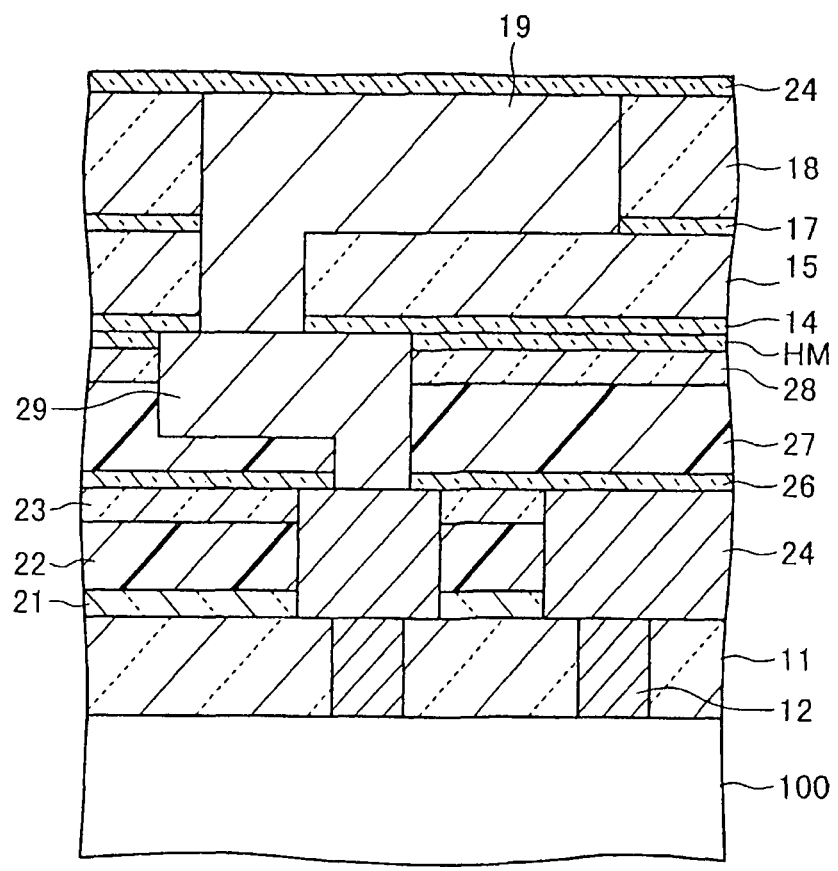
FIG. 7 is a cross sectional view of a semiconductor substrate illustrating the processes of forming a multi-layer wiring structure according to another embodiment of the invention.

FIG. 7 is a cross sectional view showing the structure of a multi-layer wiring structure according to another embodiment of the invention. After a necessary structure is formed on a silicon substrate 100, a PSG layer 11 having a thickness of about 1.5 μm is formed and a tungsten plug 12 is buried in the PSG layer 11.

Covering the surface of the W plug 12, an SiC layer 21 is deposited to a thickness of about 30 nm. On this SiC layer, an organic insulating layer 22 (made of SiLK-J150 (registered trademark of the Dow Chemical Company)) is formed to a thickness of about 450 nm. The surface of the organic insulating film 22 is covered with a silicon oxide layer 23 having a thickness of about 100 nm. This lamination structure forms first interlayer insulating layers 21, 22 and 23.

A wiring groove is formed through the first interlayer insulating layers and a copper wiring 34 is buried therein. After the surface of the copper wiring 34 is planarized, an SiC layer 36 of about 50 nm in thickness, an organic insulating layer 37 (made of SiLK-J350 (registered trademark of the Dow Chemical Company)) of about 450 nm in thickness and a silicon oxide layer 38 of about 100 nm in thickness are formed. On the surface of the silicon oxide layer 38, a hard mask layer HM of SiN is formed to a thickness of about 50 nm.

A dual damascene trench is formed by using a photoresist mask and the pattern of the hard mask HM. After the dual damascene trench is formed, a barrier metal layer and a seed layer are formed by sputtering, and a Cu layer is plated to bury the dual damascene trench and form a dual damascene Cu wiring 29. The hard mask layer HM may be removed during CMP of planarizing the surface of the dual damascene wiring 29.

Covering the surface of the dual damascene wiring 29, an SiC layer 14 having a thickness of about 70 nm is formed by using ESL3 (registered trademark) of Novellus Systems, Inc. On the SiC layer 14, an SiOC layer 15 of TORAL Is formed to a thickness of about 350 nm. On the surface of the SiOC layer, an SiC layer 17 of about 30 nm in thickness and an SiOC layer (Toral layer) 18 of about 550 nm in thickness are formed.

By photolithography and etching, a dual damascene trench similar to that described above is formed, and a copper wiring is buried therein. By repeating similar processes, a fourth wiring layer can be formed on the third wiring layer by using an SiOC layer as an interlayer insulating layer. Wiring layers can be stacked as necessary.

Heat treatment for 30 minutes at 400° C. was repeated five times for the multi-layer wiring structure formed in the above manner. No film peel-off was observed.

Other novel SiOC layers may be used in place of TORAL. For example, the SiOC layers 15 and 18 of the above-described structure were formed by using SiOC-B. The film forming conditions are the same as those described above. Film peel-off was observed not at all after repeating heat treatment for 30 minutes at 400° C. five times.

Large thermal stress is considered to be applied to the boundary region between the organic insulating layer 27 having a large thermal expansion coefficient and the SiOC layer 15 having a relatively small thermal expansion coefficient. However, no crack was formed in the third interlayer insulating film.

When an SiOC layer of CORAL was used in place of the novel SiOC layer, peel-off was observed at the interface between the SiC layer and the SiOC layer of CORAL after similar heat cycle tests, and crack was formed which is supposed resulting from the third layer wiring layer.

When the number of layers of a multi-layer wiring structure increases, various types of interlayer insulating films can be used depending upon the type of each wiring layer.

Figure 8:
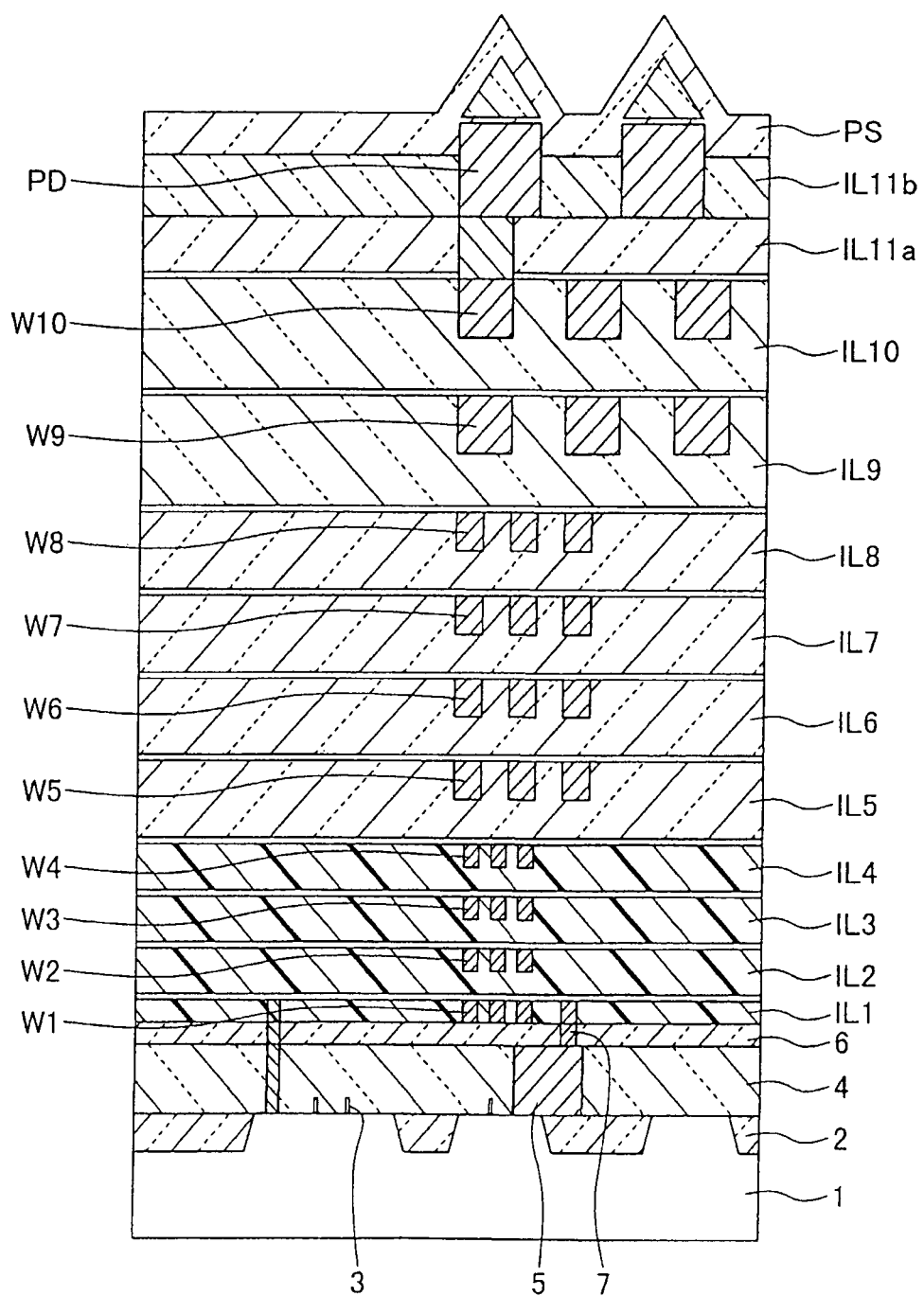
FIG. 8 is a schematic cross sectional view showing the structure of a semiconductor integrated circuit device having a multi-layer wiring structure.

FIG. 8 is a schematic diagram showing the structure of a semiconductor integrated circuit device having a multi-layer wiring structure. Formed on the surface of a silicon substrate 1 are an element isolation region 2 by shallow trench isolation, a gate electrode 3 on the active region surface and a MOS transistor structure. A PSG layer 4 is formed burying the gate electrode 3 and a W plug 5 is buried in the PSG layer. A silicon oxide layer 6 is formed on the surface of the PSG layer and a via conductor 7 is buried in the silicon oxide layer.

On the silicon oxide layer 6, a first interlayer insulating film IL1 made of organic insulator is formed and a copper wiring W1 is buried therein. On the first interlayer insulating film IL1, a second interlayer insulating film IL2, a third interlayer insulating film IL3 and a fourth interlayer insulating film IL4 are formed by using organic insulator. Copper wirings W2, W3 and W4 are buried in the respective interlayer insulating films.

On the fourth wiring layer, an interlayer insulating film IL5 of SiOC is formed and a copper wiring W5 is buried therein. On the fifth interlayer insulating film IL5, a sixth interlayer insulating film IL6, a seventh interlayer insulating film IL7 and an eighth interlayer insulating film IL8, of similar structure as the fifth interlayer insulating film, are sequentially stacked and copper wirings W6, W7 and W8 are buried therein.

An interlayer insulating film IL9 of silicon oxide is formed covering the eighth copper wiring W8, and a copper wiring W9 is buried therein. On the interlayer insulating film, an interlayer insulating film IL10 of silicon oxide and a copper wiring W10 are formed, which are covered with an interlayer insulating film IL11a of silicon oxide. In the interlayer insulating film IL11a, via conductors are embedded, and then covered with another interlayer insulating film IL11b. openings for pads are formed through the interlayer insulating film IL11b, and aluminum pads PD (and upper most wirings) are formed on the via conductors embedded in the interlayer insulating film IL11. A protective film PS is formed covering the pads PD.

In this multi-layer wiring structure, the organic interlayer insulating films are used for the first to fourth wirings having the narrowest wiring space, the SiOC interlayer insulating films are used for the fifth to eighth wiring layers, and the silicon oxide layers are used for the ninth to eleventh interlayer insulating films. Proper interlayer insulating films are selected depending upon the wiring space so that the multi-layer wiring structure can be formed which has high reliability and high performance.

The present invention has been described in connection with the preferred embodiments. The invention is not limited only to the above embodiments. For example, the number of wiring layers can be determined as desired. Material other than Cu may be used as the wiring material. If a higher specific dielectric constant is permitted, a TORAL layer having a specific dielectric constant of about 3.1 or higher may also be used. It will be apparent to those skilled in the art that other various modifications, improvements, combinations, and the like can be made.

We claim:

1. A method of manufacturing a semiconductor device comprising:
   preparing an underlying structure including a semiconductor substrate, a copper wiring formed above the semiconductor substrate and a first silicon carbide layer covering said copper wiring;
   growing a first silicon oxycarbide layer on the underlying structure by vapor deposition using, as source gas, tetra methylcyclotetrasiloxane, carbon dioxide gas and oxygen gas, a first flow rate of the oxygen gas being at most 3% of a flow rate of the carbon dioxide gas;
   growing a second silicon oxycarbide layer on the first silicon oxycarbide layer by vapor deposition under a different condition from the condition of growing the first silicon oxycarbide layer;
   growing a third silicon oxycarbide layer above said second silicon oxycarbide layer by vapor deposition using, as source gas, tetra methylcyclotetrasiloxane, carbon dioxide gas and oxygen gas, a second flow rate of said oxygen gas being at most 3% of a flow rate of the carbon dioxide gas;
   growing a fourth silicon oxycarbide layer on the third silicon oxycarbide layer by vapor deposition under a different condition from the condition of growing the third silicon oxycarbide layer;
   forming a via hole in the first silicon oxycarbide layer and the second silicon oxycarbide layer;
   forming a trench, which is connected to the via hole, in the third silicon oxycarbide layer and the fourth silicon oxycarbide layer; and
   forming a conductive layer in the via hole and the trench.

2. The method of manufacturing a semiconductor device according to claim 1, wherein the second silicon oxycarbide layer is grown by the vapor deposition using, as source gas, tetra methylcyclotetrasiloxane, carbon dioxide gas and oxygen gas.

3. The method of manufacturing a semiconductor device according to claim 1, wherein the first flow rate of said oxygen gas is 0%.

4. The method of manufacturing a semiconductor device according to claim 1, further comprising:
   after growing the first silicon oxycarbide layer, oxidizing a surface of the first silicon oxycarbide layer with plasma of O containing gas.

5. The method of manufacturing a semiconductor device according to claim 4, wherein the O containing gas includes at least one of $CO_2$ and $NO_2$.

6. The method of manufacturing a semiconductor device according to claim 1, further comprising
   forming a silicon carbide layer on the second silicon oxycarbide layer before forming the third silicon oxycarbide layer.

7. The method of manufacturing a semiconductor device according to claim 6, wherein the via hole is formed in the third silicon oxycarbide layer, the fourth silicon oxycarbide layer and the silicon carbide layer.

* * * * *

UNITED STATES PATENT AND TRADEMARK OFFICE
CERTIFICATE OF CORRECTION

| | | |
|---|---|---|
| PATENT NO. | : 8,778,814 B2 | |
| APPLICATION NO. | : 13/966326 | |
| DATED | : July 15, 2014 | |
| INVENTOR(S) | : Owada et al. | |

It is certified that error appears in the above-identified patent and that said Letters Patent is hereby corrected as shown below:

On the title page Item [72]:

Delete

Item "[72]:   Tamotsu Owada, Kawasaki (JP);
             Shun-ichi "Furuyama"; Kawasaki (JP);
             Hirofumi Watantani, Kawasaki (JP);
             Kengo Inoue, Kawasaki (JP); **Atsuo
             Shimizu**, Kawasaki (JP)"

Insert

Item --[72]: Tamotsu Owada, Kawasaki (JP);
             Shun-ichi --Fukuyama--; Kawasaki (JP);
             Hirofumi Watantani, Kawasaki (JP);
             Kengo Inoue, Kawasaki (JP);
             Atsuo Shimizu, Kawasaki (JP)--

Signed and Sealed this
Fourteenth Day of October, 2014

Michelle K. Lee
*Deputy Director of the United States Patent and Trademark Office*